United States Patent
Mosley

(10) Patent No.: US 6,631,540 B2
(45) Date of Patent: Oct. 14, 2003

(54) METHOD OF FORMING A LOW INDUCTANCE HIGH CAPACITANCE CAPACITOR

(75) Inventor: Larry E. Mosley, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 09/740,781

(22) Filed: Dec. 19, 2000

(65) Prior Publication Data

US 2001/0038521 A1 Nov. 8, 2001

Related U.S. Application Data

(63) Continuation of application No. 09/447,915, filed on Nov. 23, 1999, now Pat. No. 6,262,877.

(51) Int. Cl.$^7$ .................................................. H01G 7/00
(52) U.S. Cl. ....................... 29/25.42; 29/25.41; 29/469; 29/831; 29/832; 361/303; 361/305; 361/306.1; 361/306.2; 259/306; 259/310
(58) Field of Search ............................. 29/25.41, 25.42, 29/469, 831, 832, 842, 846; 361/303, 305, 306.1, 306.2, 306.3, 308.1, 309, 311–313; 257/306, 310, 528, 531, 532

(56) References Cited

U.S. PATENT DOCUMENTS

| | | | |
|---|---|---|---|
| 3,686,535 A | * | 8/1972 | Piper et al. .................. 361/529 |
| 3,714,529 A | * | 1/1973 | Cowpland et al. .......... 361/304 |
| 4,090,231 A | * | 5/1978 | Millard et al. ............... 361/529 |
| 4,494,170 A | * | 1/1985 | Schilling .................. 361/306.2 |
| 4,532,572 A | * | 7/1985 | Schilling .................. 361/306.2 |
| 4,628,405 A | * | 12/1986 | Lippert ..................... 361/321.4 |
| 4,641,112 A | * | 2/1987 | Kohayakawa ................ 333/140 |
| 4,731,696 A | * | 3/1988 | Himes et al. ................ 361/313 |
| 4,866,566 A | * | 9/1989 | Nishiyama ................ 361/306.2 |
| 5,323,138 A | * | 6/1994 | Oki et al. ..................... 338/307 |
| 5,528,083 A | * | 6/1996 | Malladi et al. ............. 257/786 |
| 5,659,456 A | * | 8/1997 | Sano et al. ............... 361/321.4 |
| 5,666,004 A | * | 9/1997 | Bhattacharyya et al. .... 257/724 |
| 5,685,968 A | * | 11/1997 | Hayakawa et al. .......... 205/122 |
| 5,835,339 A | * | 11/1998 | Sakamoto et al. ........ 361/321.2 |
| 5,877,934 A | * | 3/1999 | Sano et al. .................. 361/312 |
| 6,151,220 A | * | 11/2000 | Sakamoto et al. ........... 361/773 |
| 6,285,542 B1 | * | 9/2001 | Kennedy et al. ............. 361/328 |

* cited by examiner

*Primary Examiner*—Peter Vo
*Assistant Examiner*—Paul D Kim
(74) *Attorney, Agent, or Firm*—Blakely, Sokoloff, Taylor & Zafman LLP

(57) ABSTRACT

A method of forming a capacitor with low inductance connection terminals, comprising a first surface including a first electrode of porous metal, forming a dielectric layer on the first electrode, forming a second electrode on the dielectric layer, attaching a plurality of electrically coupled connection terminals to the first electrode on the first surface and attaching a plurality of electrically coupled connection terminals to the second electrode on the first surface.

12 Claims, 4 Drawing Sheets

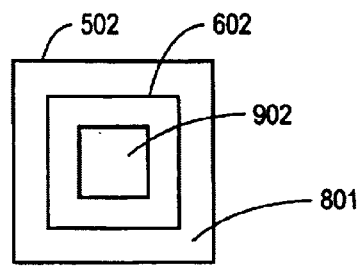
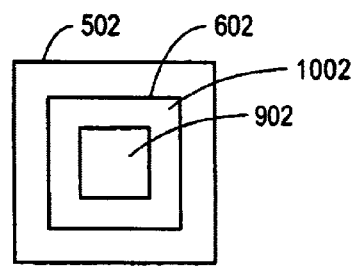
FIG. 9          FIG. 10
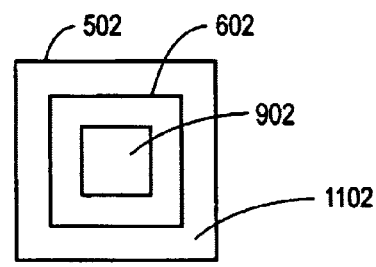
FIG. 11
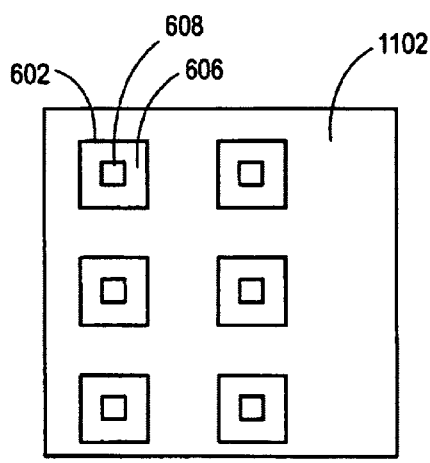
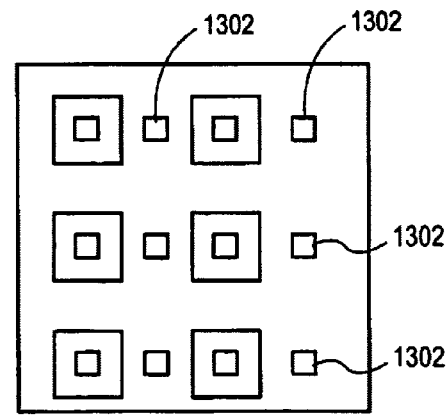
FIG. 12          FIG. 13

METHOD OF FORMING A LOW INDUCTANCE HIGH CAPACITANCE CAPACITOR

This is a continuation of application Ser. No. 09/447,915 filed on Nov. 23, 1999, now U.S. Pat. No. 6,262,877.

BACKGROUND OF THE INVENTION

1. Field of the Invention

The invention relates to generally to capacitors and the manufacture thereof, and more particularly relates to high capacitance, low inductance capacitors suitable for use with high speed integrated circuits.

2. Background

Advances in semiconductor manufacturing technology have led to dramatic increases in both the number and speed of operation of the transistors present in integrated circuits. Such integrated circuits with large numbers of fast switching transistors tend to require a large amount of decoupling capacitance. As is well known in this field, decoupling capacitance refers to the capacitance, typically added intentionally to a circuit, between the power and ground nodes.

Traditionally, decoupling capacitors used in conjunction with integrated circuits have been mounted on printed circuit boards in close proximity to the integrated circuits themselves. However, as switching speeds have increased and the amount of current being switched increased, the need for larger amounts of decoupling capacitance has also increased.

One of the problems faced by engineers in trying to provide greater amounts of decoupling capacitance includes the physical space on printed circuit boards required for the additional capacitors. Another problem is the parasitic inductance introduced by the leads of the capacitors used to connect the capacitors to various circuit nodes. This parasitic inductance degrades the effectiveness of the decoupling capacitor.

What is needed is a capacitor having a high capacitance value, and low inductance, while consuming a small area. What is further needed is a method of manufacturing such a capacitor.

SUMMARY OF THE INVENTION

Briefly, a capacitor having first and second electrodes separated by a dielectric, has first and second major surfaces, and includes terminals coupled to the first electrode and terminals coupled to a second electrode, where both sets of terminals are located on the first major surface of the capacitor.

In a further aspect of the present of invention, the capacitor may additionally have terminals coupled to the first electrode on the second surface, and terminals coupled to the second electrode on the second surface.

BRIEF DESCRIPTION OF THE DRAWINGS

FIG. 9 is a top view of the structure of FIG. 8, after the mask has been removed from the terminal.

FIG. 10 is a top view of the structure of FIG. 9, after a patterned masking layer is formed over an outer annular portion of the terminal.

FIG. 11 is a top view of the structure of FIG. 10, after metal is plated over the oxide layer, thereby forming a second electrode.

FIG. 12 is a top view of the capacitor showing a plurality of the terminal structures.

FIG. 13 is a top view of the capacitor of FIG. 12, after terminals electrically coupled to the second electrode are formed.

DETAILED DESCRIPTION

Overview

Embodiments of the present invention provide capacitor structures that are particularly well suited for use as decoupling capacitors with integrated circuits. These capacitors include connections on at least one surface thereof to both of the capacitor electrodes.

More particularly, embodiments of the present invention include porous tantalum oxide capacitors having multiple lands, i.e., connection terminals, which reduce the inherent self-inductance and resistance, and may further include terminals on both sides of the capacitor so that power and ground connections can be made through the capacitor to an associated integrated circuit. Capacitors in accordance with the present invention may be formed from metals other than tantalum, including but not limited to aluminum and niobium.

Terminology

The terms, chip, integrated circuit (IC), monolithic device, semiconductor device or component, microelectronic device or component, and similar expressions are often used interchangeably in this field. The present invention is applicable to all the above as they are generally understood in the field.

The term vertical, as used herein, means substantially perpendicular to a surface.

Porous tantalum has a very large surface area which is desirable for the formation of capacitors with high capacitance per unit volume. In conventional tantalum oxide capacitors, a single terminal may be produced by molding a tantalum pellet/wax mixture around a lead, i.e., a wire. Pellets may also be referred to in this field as powder, and correspondingly the tantalum pellet/wax mixture may be referred to as a tantalum powder/wax mixture. In conventional processes, tantalum pellets are embedded in a binding material such as wax. The mixture is then heated to a point where the tantalum pellets weld together. The wax is then removed and the result is a piece of porous tantalum with an embedded lead. The embedded lead is one terminal of the capacitor.

The other terminal is added after an oxide is grown over the porous tantalum and a metal layer is plated over the oxide. This typically results in a structure in the form of a can around the capacitor. While such a structure provides a high value of capacitance, it also results in a relatively large inductance (often on the order of micro henries).

Structural Examples

Figure 1A:
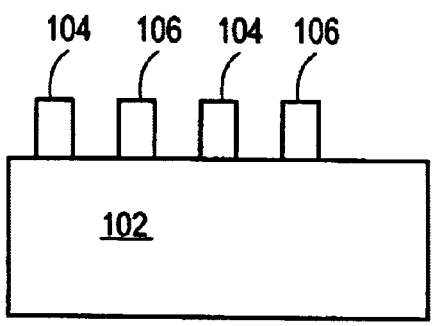
FIG. 1A is a side view of a capacitor in accordance with the present invention showing terminals disposed on one surface of the capacitor enabling connection to both electrodes of the capacitor.
Figure 1B:
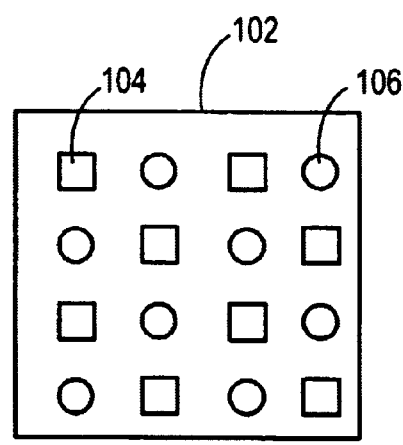
FIG. 1B is a top view of the capacitor of FIG. 1A showing an arrangement of terminals disposed on one surface of the capacitor.

Referring to FIGS. 1A–1B, in one illustrative embodiment of the present invention, a capacitor 102 includes a porous Ta electrode with a tantalum oxide layer grown over a substantial portion thereof, and a second Ta electrode disposed over the tantalum oxide dielectric layer. Each Ta electrode has a plurality of terminals 104, 106 electrically coupled thereto. As shown in FIGS. 1A–1B, capacitor 102 has a substantially rectangular shape. Other shapes may be utilized in accordance with the present invention.

Terminals 104, 106 are electrically conductive contact structures that provide points electrical connection between capacitor 102 and other circuit elements, including but not limited to, integrated circuits. In some embodiments, terminals 104, 106 may also provide the means of physical connection to an integrated circuit.

Terminals 104, 106 in the illustrative embodiment are made of tantalum metal, however the present invention is not so limited and other conductive materials, metals, or alloys may be used to form terminals 104, 106. Those skilled in the art will recognize that, as with any material, there may be traces of various elements, including nonconductive materials in terminals 104, 106. In alternative embodiments an oxidation barrier may be disposed over at least a portion of a terminal 104, 106. Gold, which has good electrical conduction properties, may be used as an oxidation barrier for tantalum terminals 104, 106.

FIG. 1B shows a top view of capacitor 102, having terminals 104, 106 disposed on a first surface thereof. In the embodiment illustrated in FIG. 1B, an alternating arrangement of terminals is shown. FIG. 13, shows a top view of an alternative arrangement for terminals wherein the terminals for each electrode are arranged in rows.

Figure 2:
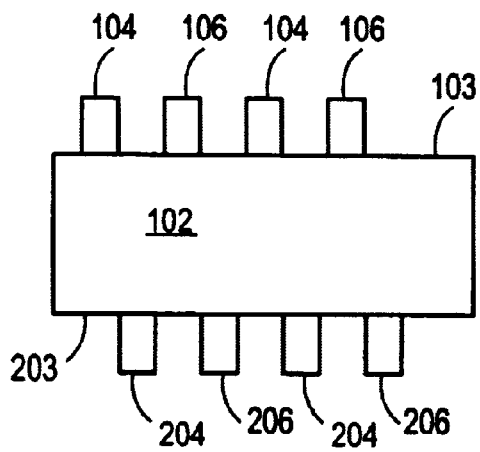
FIG. 2 is a side view of an alternative capacitor in accordance with the present invention showing terminals for connection to both electrodes disposed on a first surface, and terminals for connection to both electrodes disposed on a second surface.

FIG. 2 is a side view of rectangular capacitor 102, with terminals disposed on each of two major surfaces 103, 203. In particular, terminals 104 are coupled to a first electrode on first surface 103, terminals 106 are coupled to a second electrode on first surface 103, terminals 204 are coupled to the first electrode on second surface 203, and terminals 206 are coupled to the second electrode on second surface 203. Terminals on second surface 203 need not be same shape, size or pitch as terminals on first surface 103.

Figure 3:
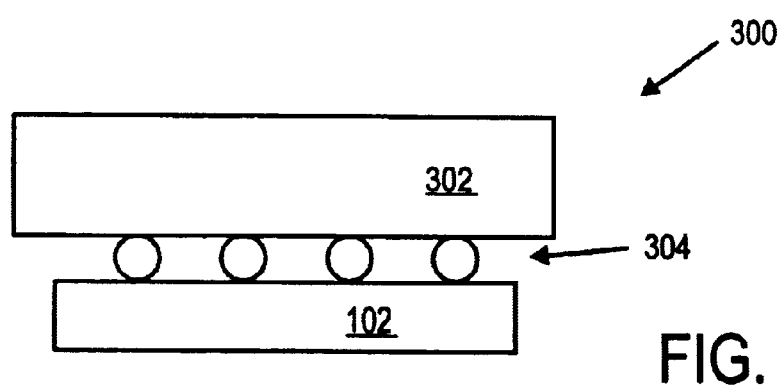
FIG. 3 is a side view of an electronic assembly including a capacitor in accordance with the present invention coupled to an integrated circuit.
Figure 4:
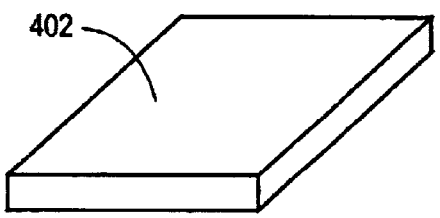
FIG. 4 shows a rectangular block of tantalum pellets, sometimes referred to as powder, distributed in a binding material.

FIG. 3 shows an electronic assembly 300 which includes an integrated circuit 302, capacitor 102, and connections 304. Integrated circuit 302 may be an IC of any functionality and made by any process. IC 302 may be a microprocessor, but is not limited to any such functionality. Capacitor 102 is a capacitor in accordance with the present invention as described above in conjunction with FIGS. 1A–1B. Connections 304 may be made by way of solder bumps, but are not so limited. Solder bump connections may be made by forming solder bumps on terminals 104, 106, bringing the solder bumps into alignment and contact with corresponding lands (also referred to as pads) on IC 302 and reflowing the solder so as to form a physical and electrical connection between IC 302 and capacitor 102. Alternatively, solder bumps may be formed on IC 302, and then reflowed after being brought into alignment and contact with terminals 104, 106 so as to form a physical and electrical connection between IC 302 and capacitor 102. Those skilled in the art and having the benefit of the present disclosure, will appreciate that IC 302 and capacitor 102 may alternatively be electrically coupled through an interposer disposed between IC 302 and capacitor 102. However, it is preferable to keep the length of the electrical connections as short as possible to provide reduced parasitic inductance.

Process Examples

Referring to FIGS. 4–13, an exemplary process embodying the present invention is described.

Figure 5:
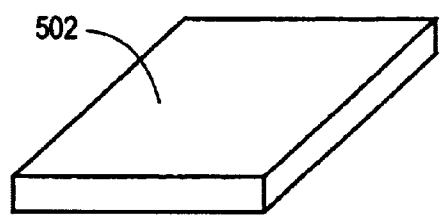
FIG. 5 shows the rectangular block of FIG. 4, after the tantalum pellets are fused and the binding material is removed, resulting in a substantially rectangular block of porous tantalum metal.
Figure 6:
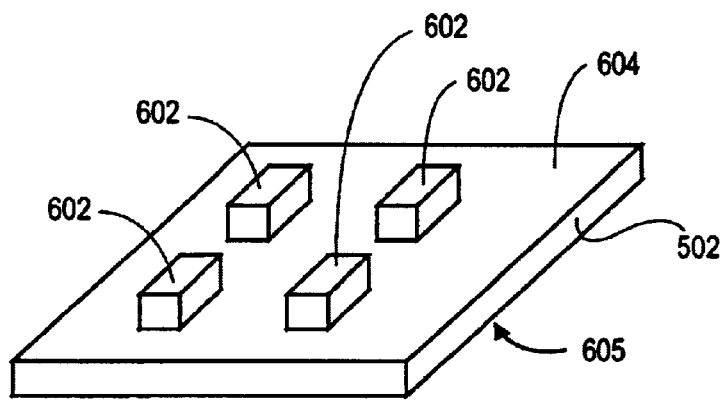
FIG. 6 shows the rectangular block of FIG. 5, after conductive terminals have been formed on a surface of the block, that is in electrical contact with a first electrode.

In an exemplary embodiment of the present invention, a tantalum pellet/wax mixture is formed into a plate or brick 402. This plate may be, but is not required to be, sized to be approximately the length and width of an integrated circuit with which it is to be used. The thickness of plate 402 is typically in the range of 10 to 100 mils (i.e., approximately 0.25 to 2.5 millimeters) thick. Plate 402 is heated until the tantalum metal fuses. The wax is then removed resulting in a plate of porous tantalum metal 502, as shown in FIG. 5. One significant difference between the illustrative embodiment of the present invention and conventional processes of forming tantalum oxide capacitors is forming the porous tantalum into a plate. As shown in FIG. 6, terminals 602 are formed on a surface 604 of plate 502. It is desirable that good electrical contact is made between terminals 602 and the tantalum of plate 502 so as to obtain a low resistance connection. In this illustrative embodiment, terminals 602 are made of tantalum. Terminals 602 may be deposited onto the Ta, or the Ta may first be masked where the terminals are undesired, and then plated, followed by removal of the mask.

Figure 7:
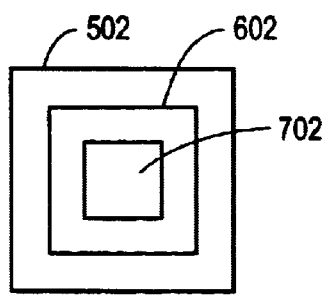
FIG. 7 is a top view of a conductive terminal on the rectangular block with a patterned mask protecting a central portion of the terminal.

FIG. 7, shows a top view of a portion of plate 502 with terminal 602 disposed thereon. Additionally, it can be seen in FIG. 7, that a masking layer 702 has been patterned over a central portion of terminal 602. Masking layer 702 is patterned over a central portion of terminals 602 subsequent to their formation to prevent undesired oxidation thereof. Since porous tantalum plate 502 is oxidized during the process of forming a capacitor in accordance with the present invention, it is necessary to form mask 702 so as to prevent oxidation of at least a portion of each terminal 602.

Figure 8:
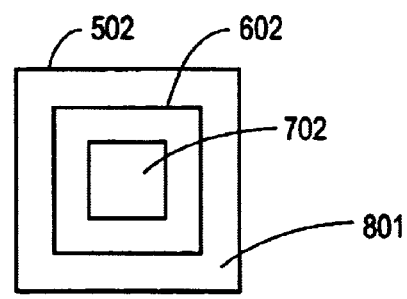
FIG. 8 is a top view of the structure of FIG. 7, after the block and exposed portions of the terminal have been oxidized.

FIG. 8 shows the structure of FIG. 7, after an oxidation operation. More particularly, FIG. 8, shows a portion of oxidized plate 502, with the unmasked portion 606 of terminal 602 also oxidized. The oxidized surface 801 of plate 502 and the unmasked portion 606 of terminal 602 are oxidized concurrently in the illustrative embodiment of the present invention. Oxidation of tantalum is well known in this field and specific oxidation conditions are not discussed further here.

FIG. 9 shows the structure of FIG. 8, after the process operation of stripping off mask 702 from terminal 602 thereby exposing unoxidized tantalum portion 902 of terminal 602. FIG. 10 shows the structure of FIG. 9, after the additional process operation of patterning a masking layer 1002 over a portion of terminal 602 so as to protect this area from being plated during a subsequent plating operation. As shown in FIG. 10, masking layer 1002 covers an outer annular portion of terminal 602. Masking layer 1002 is formed so as to substantially cover the oxidized portion of terminal 602 while leaving substantially exposed the bare, i.e., unoxidized portion, of terminal 602.

FIG. 11 shows the structure of FIG. 10, after the process operation of plating the exposed tantalum oxide with a layer of conductive material 1102. After the tantalum oxide is formed, the capacitor body may be dipped into a solution of manganese oxide (MnO), which forms a second conductive surface. This second conductor is also sometimes referred to as a cathode, the first surface being an anode (Ta capacitors are bias dependent). The capacitor structure then may be dipped in a carbon powder, followed by a silver paint to form the second electrode.

One way of providing an electrical contact to the outside world during the oxidation/manganization process is to use a Ta rod as is used in the conventional process of making tantalum oxide capacitors. A washer is placed over the Ta rod to prevent the liquid from wicking up the rod which prevents shorting.

FIG. 12 is a top view of plate 502 after being oxidized, having tantalum 1102 plated thereon, and having terminals 602 formed. As can be seen in FIG. 12, terminals 602, have a tantalum oxide portion 606 and a tantalum portion 608. Tantalum oxide portion 606 corresponds to the oxidized portion of the surface of terminal 602.

FIG. 13 is a top view of the structure of FIG. 12, after the process operations of forming terminals 1302 on the same surface of the capacitor as terminals 602. Terminals 1302 are made of tantalum in the illustrative embodiment but are not so limited. Any suitable conductive material may be used to form terminals 1302. Terminals 602 are typically masked during the formation of terminals 1302. In alternative embodiments of the present invention, the terminals may be formed of various conductive materials, in various shapes, and at various pitches. For example, the terminals may be formed as solder bumps, or solder balls. Solder bumps and balls are known in this field and typically comprise a Pb/Sn solder. The sizes, shapes, and pitches may be different between the first and second surfaces of the capacitor.

As a result of the processing operations described above, a first set of terminals 602 is in electrical contact with a first electrode of the capacitor, and a second set of terminals 1302 is in electrical contact with a second electrode of the capacitor. In this case the first electrode is the porous tantalum metal formed from pellet/wax plate 402, and the second electrode is the tantalum metal plated onto the tantalum oxide layer formed by oxidizing porous tantalum plate 502. Terminals 602 and 1302 are electrically isolated from each other, as can be seen in FIG. 13.

An insulative coating (not shown) may be provided on the outer surfaces of the capacitor which are not required to be exposed for purpose of making electrical connection to the capacitor.

A third and fourth set of terminals can be formed on the underside of the capacitor in a manner similar to that described above in connection with the first and second sets of terminals. As will be understood by those skilled in the art and having the benefit of this description, by having terminals on the underside, electrically coupled, respectively, to the first and second electrodes of the capacitor, there will be electrical continuity between the upper and under sides of the capacitor, thereby providing increased flexibility for use in a printed circuit board or other system level environment.

Figure 14:
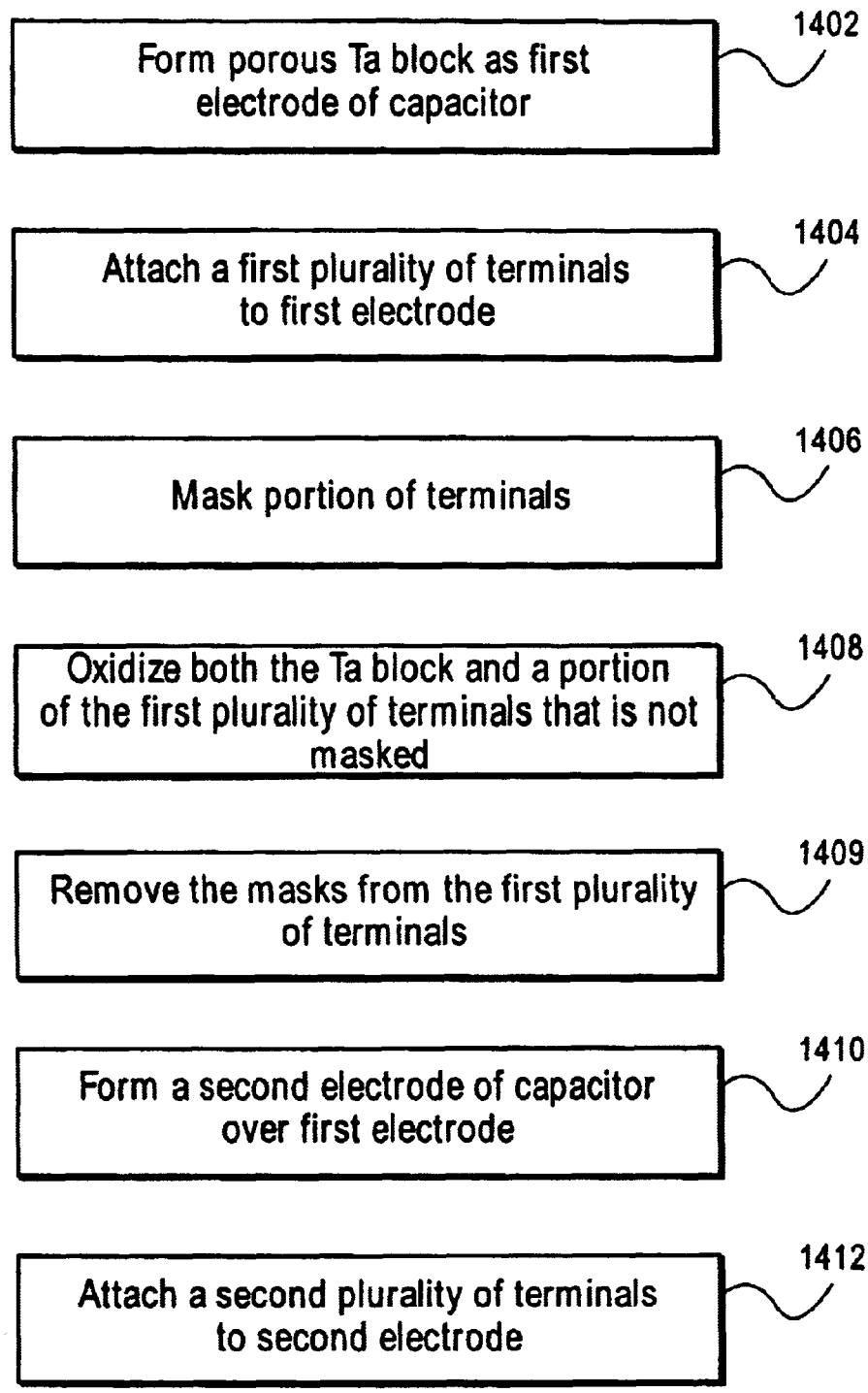
FIG. 14 is a flow diagram illustrating the various operations in an exemplary manufacturing process in accordance with the present invention.

An illustrative process in accordance with the present invention is described in conjunction with the flow diagram of FIG. 14. A porous block of Ta is formed as the first electrode of the capacitor (block 1402). A first plurality of terminals is then attached to the first electrode (block 1404). By having a large number of terminals, a low resistance, low inductance, connection to other circuit elements is achievable. A portion of each of the plurality of terminals is then masked to protect these portions from a subsequent oxidation operation (block 1406). The exposed tantalum is then oxidized (block 1408). The tantalum oxide is then coated with another metal layer, so as to form the second electrode of the capacitor (block 1410). This metal may be tantalum, or it may comprise one or more conductive layers such as, for example, a layer manganese oxide, a layer of carbon, and a layer of silver. A second plurality of terminals is then attached to the second electrode (block 1412). The second plurality of terminals is may be formed of tantalum. However, in typical applications of the present invention, the material composition of the second plurality of terminals will depend on the type of termination required, e.g., solder bumps such as C4 bumps or ball grid array (BGA) bumps, plated-through-hole vias in the package, and so on. For example, solder bumps typically contain a lead and tin in various proportions depending on the desired melting point.

Conclusion

A large number of terminals can be put on the surface of the capacitor. By forming these terminals close together, the self-inductance can be made small. The porosity of the material provides a large surface area which is preferred for the formation of high values of capacitance per unit volume. Because terminals are only needed on one side of the capacitor, low inductance can be achieved. In other words, the terminals which provide electrical connection to the first and second electrodes of the capacitor are co-located on a single surface of the capacitor, thereby providing a very short connection path between the capacitor and an associated circuit element, such as an IC. The short connection path results in a smaller parasitic inductance than can be achieved with conventional capacitor connection schemes.

The underside set of terminals is an option that can be used to provide a lower inductance connection to, for example, a next level of decoupling capacitance.

Embodiments of the present invention provide capacitors with high capacitance per unit volume and connections with low parasitic inductance.

Embodiments of the present invention provide a method of making tantalum oxide capacitors with multiple terminals for each electrode to provide an inductance orders of magnitude less than conventional tantalum oxide capacitors.

An advantage of particular embodiments of the present invention is that large values of decoupling capacitance can be included in a circuit without consuming large amounts of printed circuit board area.

An advantage of particular embodiments of the present invention is that large values of decoupling capacitance can be included in a circuit without introducing large amounts of parasitic inductance.

It will be understood by those skilled in the art having the benefit of this disclosure that many design choices are possible within the scope of the present invention. For example, the capacitor electrodes and terminals may be made of other conductive materials than those described above. When electrodes are formed of other conductive materials, the dielectric material similarly will be formed from different materials. For example, while a tantalum electrode will be oxidized to form a tantalum oxide dielectric layer, an aluminum electrode will be oxidized to form an aluminum oxide dielectric layer, and a niobium electrode will be oxidized to form a niobium oxide dielectric layer. Furthermore, capacitors in accordance with the present invention may have shapes other than rectangular.

It will be understood that various other changes in the details, materials, and arrangements of the parts and steps which have been described and illustrated may be made by those skilled in the art having the benefit of this disclosure without departing from the principles and scope of the invention as expressed in the subjoined Claims.

What is claimed is:

1. A method of forming a capacitor, comprising:
   forming a porous tantalum (Ta) block as a first electrode of the capacitor;
   attaching a first plurality of terminals to a surface of the Ta block;
   masking a portion of the first plurality of terminals, thus forming masked and unmasked portions of the first plurality of terminals;
   oxidizing both the surface of the Ta block and the unmasked portions of the first plurality of, to form an oxidized Ta surface and oxidized terminal portions;
   removing the masks from the first plurality of terminals;
   masking the oxidized terminal portions of the first plurality of terminals;
   forming a second electrode on the oxidized Ta surface of the Ta block, the oxidized portion of the first plurality of terminals being protected by masks; and
   attaching a second plurality of terminals to the second electrode,
   wherein the capacitor has two major surfaces and the first and second plurality of terminals are co-located on the same major surface of the capacitor.

2. The method of claim 1, wherein masking the portion of the first plurality of terminals comprises masking the portion of each of the first plurality of terminals.

3. The method of claim 1, wherein forming the second electrode comprises forming a layer of an electrically conductive material on the oxidized Ta surface of the Ta block.

4. The method of claim 3, wherein the electrically conductive material is selected from the group consisting of Ta, carbon and silver.

5. The method of claim 3, wherein forming the layer of electrically conductive material comprises forming a layer of manganese oxide, a layer of carbon, and a layer of silver.

6. The method of claim 3, wherein forming the layer of the electrically conductive material over the Ta block comprises dipping the Ta block into a solution of manganese oxide to form a conductive surface over the Ta block.

7. The method of claim 6, further comprising dipping the conductive surface in a carbon powder to form a carbon layer.

8. The method of claim 7, further comprising applying a silver paint over the carbon layer.

9. The method of claim 6, wherein the first plurality of terminals comprise Ta, and the masked portions of the first plurality of terminals are not oxidized.

10. The method of claim 1, wherein the second plurality of terminals comprise Ta.

11. The method of claim 1, wherein the second plurality of terminals comprise lead and tin.

12. A method, comprising:
    forming a porous tantalum (Ta) plate having first and second surfaces;
    attaching a first terminal to the first surface of the Ta plate;
    forming a first mask on a central portion of the first terminal, thus forming a masked central terminal portion and an unmasked, annular, outer terminal portion;
    oxidizing both the first surface of the Ta plate and the unmasked, annular, outer terminal portion, but not oxidizing the second surface of the Ta plate, causing the first surface of the Ta plate to be an oxidized Ta layer and the second surface of the Ta plate to be a Ta layer, the Ta layer to be a first electrode of a capacitor, and also causing the unmasked, annular, outer terminal portion to be an oxidized, annular, outer terminal portion surrounding a masked, unoxidized, central terminal portion;
    removing the first mask from the unoxidized, central terminal portion;
    forming a second mask on the oxidized, annular, outer terminal portion;
    forming an electrically conductive layer on the oxidized Ta layer, the second mask preventing the formation of the electrically conductive layer on the oxidized, annular, outer terminal portion, the electrically conductive layer to be a second electrode of the capacitor, the oxidized Ta layer to provide dielectric insulation between the first and second electrodes, the unoxidized, central terminal portion to provide a direct electrical connection through the oxidized Ta layer to the first electrode, and the oxidized, annular, outer terminal portion to electrically isolate the unoxidized, central terminal portion from the second electrode; and
    attaching a second terminal to the electrically conductive layer so that both the first and second terminals are co-located on one surface of the capacitor corresponding to the second electrode, the unoxidized, central terminal portion of the first terminal being formed directly through the capacitor and made accessible from the same side of the capacitor as is the second terminal, thus allowing electrical connection to both the first and second electrodes from the same side of the capacitor.

* * * * *